(12) United States Patent
Wu

(10) Patent No.: US 12,336,420 B2
(45) Date of Patent: Jun. 17, 2025

(54) LIGHT-EMITTING DEVICE AND FABRICATION METHOD THEREOF, DISPLAY DEVICE OR LIGHTING DEVICE

(71) Applicant: BOE TECHNOLOGY GROUP CO., LTD., Beijing (CN)

(72) Inventor: Yong Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 566 days.

(21) Appl. No.: 17/764,305

(22) PCT Filed: May 26, 2021

(86) PCT No.: PCT/CN2021/096053
§ 371 (c)(1),
(2) Date: Mar. 28, 2022

(87) PCT Pub. No.: WO2021/244369
PCT Pub. Date: Dec. 9, 2021

(65) Prior Publication Data
US 2022/0376210 A1    Nov. 24, 2022

(30) Foreign Application Priority Data

Jun. 3, 2020   (CN) .......................... 202010493184.5

(51) Int. Cl.
*H10K 59/80*    (2023.01)
*G02F 1/1335*   (2006.01)
(Continued)

(52) U.S. Cl.
CPC ..... *H10K 59/879* (2023.02); *G02F 1/133603* (2013.01); *G02F 1/133607* (2021.01);
(Continued)

(58) Field of Classification Search
CPC .... H10K 50/858; H10K 50/854; H10K 71/00; H10K 59/879; H10K 59/877;
(Continued)

(56) References Cited

U.S. PATENT DOCUMENTS

2005/0194896 A1* 9/2005 Sugita ................. H10K 59/877
                                                      313/506
2011/0012139 A1    1/2011 Yamamoto
(Continued)

FOREIGN PATENT DOCUMENTS

CN        1665361 A      9/2005
CN      101127379 A      2/2008
(Continued)

*Primary Examiner* — Kevin Quarterman
(74) *Attorney, Agent, or Firm* — The Webb Law Firm

(57) ABSTRACT

The present application relates to a light-emitting device and a fabrication method thereof, a display device or lighting device, the light-emitting device comprising: a substrate; a light-emitting structure layer disposed on one side of the substrate and comprising a light-emitting function layer; a first light extraction layer disposed on a light exit side of the light-emitting function layer, a light exit surface of the first light extraction layer having an irregular brush-like micro-nano structure.

10 Claims, 9 Drawing Sheets

(51) Int. Cl.
  *G02F 1/13357* (2006.01)
  *H10K 50/854* (2023.01)
  *H10K 50/858* (2023.01)
  *H10K 71/00* (2023.01)
(52) U.S. Cl.
  CPC ......... *H10K 50/854* (2023.02); *H10K 50/858* (2023.02); *H10K 71/00* (2023.02); *H10K 59/877* (2023.02); *H10K 59/878* (2023.02)
(58) Field of Classification Search
  CPC ............ H10K 59/878; G02F 1/133603; G02F 1/133607; G02F 1/1336; G02F 1/133614; G02F 2202/36; G02B 1/002; G02B 6/005; H05B 33/02
  See application file for complete search history.

(56) References Cited

U.S. PATENT DOCUMENTS

| | | | |
|---|---|---|---|
| 2012/0256202 A1* | 10/2012 | Lee | H01L 33/54 |
| | | | 257/E33.059 |
| 2016/0164038 A1* | 6/2016 | Shin | H10K 50/854 |
| | | | 257/40 |
| 2016/0197311 A1* | 7/2016 | Lamansky | H10K 50/858 |
| | | | 257/40 |
| 2017/0005235 A1* | 1/2017 | Chou | H10K 59/8791 |
| 2017/0110689 A1 | 4/2017 | Yang et al. | |
| 2017/0352841 A1 | 12/2017 | Lee | |
| 2017/0365816 A1 | 12/2017 | He | |
| 2019/0019976 A1* | 1/2019 | Kim | H10K 50/858 |
| 2020/0258866 A1 | 8/2020 | Wang | |
| 2021/0026057 A1* | 1/2021 | Meng | G02F 1/195 |

FOREIGN PATENT DOCUMENTS

| | | |
|---|---|---|
| CN | 101978780 A | 2/2011 |
| CN | 104795430 A | 7/2015 |
| CN | 105810841 A | 7/2016 |
| CN | 105895826 A | 8/2016 |
| CN | 107331670 A | 11/2017 |
| CN | 111613735 A | 9/2020 |
| KR | 1020130126408 A | 11/2013 |

* cited by examiner

LIGHT-EMITTING DEVICE AND FABRICATION METHOD THEREOF, DISPLAY DEVICE OR LIGHTING DEVICE

CROSS-REFERENCE TO RELATED APPLICATIONS

This application is the United States national phase of International Patent Application No. PCT/CN2021/096053 filed on May 26, 2021, and claims the priority to the Chinese patent application No. 202010493184.5 filed on Jun. 3, 2020, the disclosures of which are hereby incorporated by reference in their entirety.

FIELD

This application relates to a light-emitting device and a fabrication method thereof, a display device or lighting device.

BACKGROUND

Light extraction efficiency refers to a proportion of light entering into air from an inside of a light-emitting device, in total generated light, and is determined by luminescence efficiency of a light-emitting function layer in the light-emitting device and phenomena, such as reflection, total reflection, interference of film layers in the light-emitting device. At present, light extraction efficiency of an organic light-emitting device is about 20%, and the rest of the light is finally consumed in a non-radiation mode, so the light extraction efficiency is still low. Therefore, there is still room for improvement on related arts of light extraction of the light-emitting device.

SUMMARY

An objective of the present application is to provide a light-emitting device with high light extraction efficiency.

In an aspect of the present application, there is provided a light-emitting device. The light-emitting device comprises: a substrate; a light-emitting structure layer disposed on one side of the substrate and comprising a light-emitting function layer; a first light extraction layer disposed on a light exit side of the light-emitting function layer, a light exit surface of the first light extraction layer having an irregular brush-like micro-nano structure.

In an example, the light-emitting device further comprises: a second light extraction layer disposed on the light exit surface of the first light extraction layer, wherein a refractive index of the second light extraction layer is different from a refractive index of the first light extraction layer.

In an example, the light-emitting device satisfies at least one of the following conditions: a difference in refractive index between the first light extraction layer and the second light extraction layer being greater than 0.2; the refractive index of the first light extraction layer being greater than the refractive index of the second light extraction layer; a thickness of the second light extraction layer being less than 200 nm; a light exit surface of the second light extraction layer being a flat surface or having the irregular brush-like micro-nano structure; a material of the first light extraction layer comprising at least one of a polymer, an inorganic material or an organic small-molecule; a material of the second light extraction layer comprising at least one of a metal oxide or metal fluoride; or the second light extraction layer containing scattering particles.

In an example, the light-emitting structure layer comprises a cathode, the light-emitting function layer, and an anode, which are stacked, the anode is disposed close to the substrate, and the first light extraction layer satisfies any of the following conditions: the light-emitting device being a bottom-emission light-emitting device, the first light extraction layer being disposed on a surface of the cathode away from the light-emitting function layer; or the light-emitting device being a top-emission light-emitting device, the first light extraction layer being disposed on a surface of the substrate away from the light-emitting function layer.

In an example, the light-emitting device further comprises: a light extraction mesh film disposed on the light exit side of the light-emitting function layer, wherein the mesh film has a sponge pore structure.

In an example, the light-emitting device comprises a plurality of pixel units, each of the plurality of pixel units comprises a plurality of sub-pixels, and the light extraction mesh film satisfies at least one of the following conditions: the light extraction mesh film being a whole-layer structure, an orthographic projection of the light extraction mesh film on the substrate covering orthographic projections of the plurality of pixel units on the substrate; or the light extraction mesh film comprising a plurality of sub light extraction mesh films, an orthogonal projection of each of the sub light extraction mesh films on the substrate covering one of the sub pixels.

In an example, the light extraction mesh film satisfies at least one of the following conditions: a thickness of the light extraction mesh film being 10 nm to 30 microns; an aperture of the light extraction mesh film being 40 nm to 1 micron; or the light extraction mesh film containing scattering particles.

In an example, the light-emitting device satisfies any of the following conditions: (1) the light-emitting structure layer comprising a cathode, the light-emitting function layer and an anode, which are stacked, the anode being disposed close to the substrate, the light extraction mesh film satisfying any of the following conditions: (a) the light-emitting device being a bottom-emission light-emitting device, the light extraction mesh film being disposed on a surface of the light-emitting layer away from the anode; or (b) the light-emitting device being a top-emission light-emitting device, the light extraction mesh film being disposed on a surface of the substrate away from the light-emitting function layer; or (2) the light-emitting device being a backlight module, the light-emitting function layer being a light source of the backlight module, the light extraction mesh film being disposed on the light exit side of the light-emitting function layer.

In another aspect of the present application, there is provided a method of fabricating a light-emitting device. The method comprises: forming a light-emitting structure layer on one side of a substrate, the light-emitting structure layer comprising a light-emitting function layer; forming a first light extraction layer on a light exit side of the light-emitting function layer; and performing plasma treatment on a light exit surface of the first light extraction layer to form an irregular brush-like micro-nano structure.

In an example, the plasma treatment satisfies at least one of the following conditions: the plasma treatment adopting at least one of oxygen plasma or argon plasma; the plasma treatment being performed with a power of 150~250 W; or the plasma treatment having a duration of 90~120 seconds.

In an example, the method further comprises: forming a second light extraction layer on the light exit surface of the first light extraction layer, wherein a refractive index of the second light extraction layer is different from a refractive index of the first light extraction layer.

In an example, the method further comprises: forming a light extraction mesh film on the light exit side of the light-emitting function layer, wherein the mesh film has a sponge pore structure.

In an example, the forming a light extraction mesh film comprises: uniformly mixing raw materials for forming the light extraction mesh film to obtain a first mixture; after the first mixture is sprayed into a film, curing the film with ultraviolet radiation to obtain a cured film layer; and removing liquid crystal in the cured film layer to obtain the light extraction mesh film, wherein the raw materials comprise a monomer, a liquid crystal, a photoinitiator, and nano microbeads, or the raw materials comprise a monomer, a liquid crystal, a photoinitiator, scattering particles, and nano microbeads.

In an example, the method satisfies at least one of the following conditions: the mixing being performed using a vortex oscillator; a mass ratio of the monomer to the liquid crystal to the photoinitiator to the nano microbeads being 10:(5~12):(0.05~0.2):(0.1~0.2); amount of the scattering particles being 2-10 wt % of total mass of the monomer; the curing with ultraviolet radiation being performed at a temperature of 0-30° C., a wavelength of 365 nm, an intensity of 3-15 mW/cm$^2$, and a duration of 2-20 min; or the liquid crystal being removed by soaking in an organic solvent.

In an example, the method satisfies at least one of the following conditions: the monomer comprising at least one of an acrylate monomer, a carbonate monomer, an epoxy resin monomer, a styrene monomer, or a thiol monomer; the liquid crystal comprising at least one of a nematic liquid crystal, a cholesteric liquid crystal, or a smectic liquid crystal; the photoinitiator comprising benzoin dimethyl ether; or the nano microbeads comprising glass microbeads.

In yet another aspect of the present application, there is provided a display device or lighting device. The display device or lighting device comprises the light-emitting device described above.

DETAILED DESCRIPTION

Embodiments of the present application will be described in detail below. The embodiments described below are exemplary and only used for explaining the present application, and cannot be construed as limiting the present application. If the embodiments do not indicate techniques or conditions, they are performed according to the techniques or conditions described in the literature in the art or according to the product specification. If the reagents or instruments used do not indicate manufacturers, they are all conventional products which are commercially available.

Figure 1:
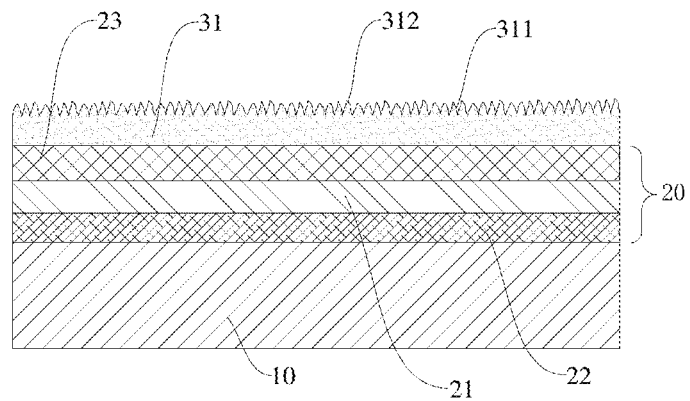
FIG. 1 is a schematic structural diagram of a light-emitting device according to an embodiment of the present application.

In an aspect of the present application, there is provided a light-emitting device. Referring to FIG. 1, the light-emitting device comprises: a substrate 10; a light-emitting structure layer 20 disposed on one side of the substrate and comprising a light-emitting function layer 21; a first light extraction layer 31 disposed on a light exit side of the light-emitting function layer 21, wherein a light exit surface 311 of the first light extraction layer 31 has an irregular brush-like micro-nano structure 312.

In the light-emitting device, the irregular brush-like micro-nano structure can change reflection and refraction conditions at the interface, so that light can be reflected and refracted to a plurality of different directions, thereby reducing the probability of occurrences of total reflection, and the irregular brush-like micro-nano structure with the shape has a greater aspect ratio, which is more beneficial to changing the reflection and refraction conditions to the direction of extracting more light, thereby significantly improving the light extraction efficiency of the light-emitting device.

Figure 2:
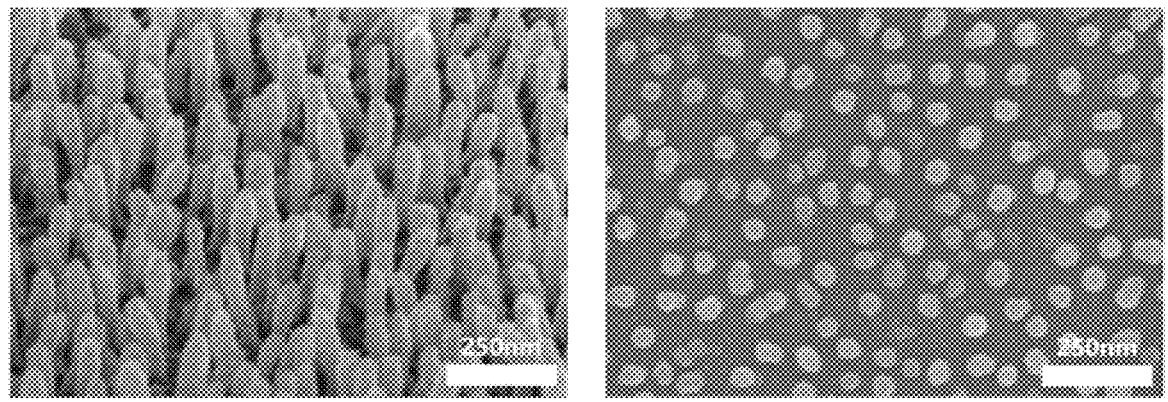
FIG. 2 is a schematic diagram of an irregular brush-like micro-nano structure according to an embodiment of the present application, wherein the left is a schematic diagram of a three-dimensional structure, and the right is a schematic diagram of a plane structure.

According to an embodiment of the present application, the expression "irregular brush-like micro-nano structure" adopted herein refers to a plurality of micron-scale or nanometer-scale protrusions and depressions, wherein each protrusion is similar to a bristle, and the plurality of protrusions form the brush-like structure, for which reference can be made to FIG. 2.

Figure 3:
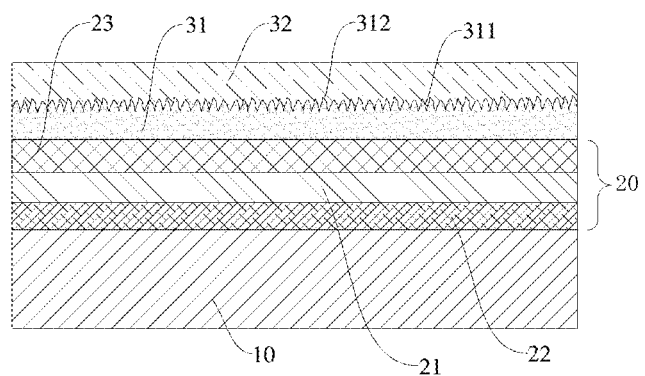
FIG. 3 is a schematic structural diagram of a light-emitting device according to another embodiment of the present application.

According to an embodiment of the present application, referring to FIG. 3, the light-emitting device can further comprise a second light extraction layer 32 disposed on the light exit surface 311 of the first light extraction layer 31, wherein a refractive index of the second light extraction layer 32 is different from a refractive index of the first light extraction layer 31. A difference in refractive index between the second light extraction layer and the first light extraction layer can further change the reflection and refraction conditions, so that the amount of light radiated out of the light-emitting device is increased, thereby effectively improving the light extraction efficiency of the light-emitting device.

According to an embodiment of the present application, in the light-emitting device, the difference in refractive index between the first light extraction layer and the second light extraction layer is greater than 0.2, which can be, for example, 0.3, 0.4, 0.5, etc., and an upper limit of the difference in refractive index depends on a refractive index limit of a material. For example, it has been verified that the greater the difference in refractive index between the first light extraction layer and the second light extraction layer, the higher the light extraction efficiency of the light-emitting device, and therefore, in the case where other conditions are permissible, the difference in refractive index between the first light extraction layer and the second light extraction layer is made as great as possible. According to an embodiment of the present application, the refractive index of the first light extraction layer is greater than that of the second light extraction layer. Under this condition, the light extraction efficiency is improved more significantly.

Figure 4:
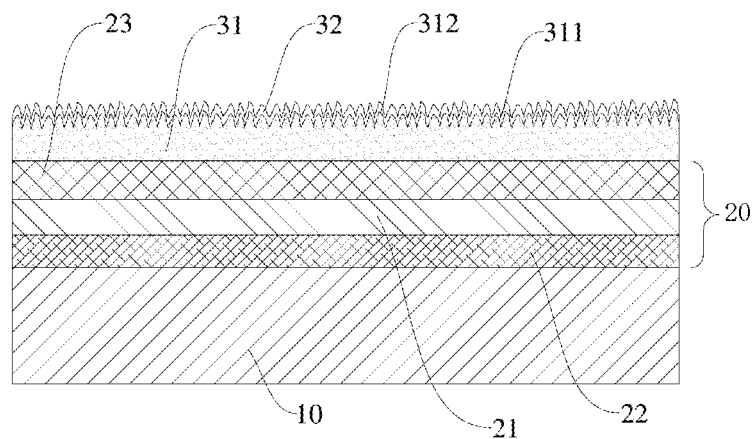
FIG. 4 is a schematic structural diagram of a light-emitting device according to another embodiment of the present application.

According to an embodiment of the present application, a thickness of the second light extraction layer is less than 200 nm, which can be, for example, 180 nm, 150 nm, 120 nm, 100 nm, 80 nm, 50 nm, 30 nm, 20 nm, etc. Therefore, the effect of improving the light extraction efficiency can be achieved, and the light transmittance will not be affected by over-thickness. Further, the light exit surface of the second light extraction layer is a flat surface (refer to FIG. 3) or has the irregular brush-like micro-nano structure (refer to FIG. 4), that is, in some embodiments, the second light extraction layer can fill the irregular brush-like micro-nano structure on the light exit surface of the first light extraction layer, and at this time, the second light extraction layer can not only improve the light extraction efficiency, but also play a role of a planarization layer, which is beneficial to formation and fabrication of a subsequent structure; and in other embodiments, the thickness of the second light extraction layer can be less than a height of the irregular brush-like micro-nano structure (i.e., a height of the protrusion therein), so that the light exit surface of the second light extraction layer can replicate the topography of the light exit surface of the first light extraction layer, and also has a substantially same irregular brush-like micro-nano structure.

According to an embodiment of the present application, a material of the first light extraction layer comprises at least one of a polymer, an inorganic material, or an organic small-molecule. In some embodiments, the material of the first light extraction layer is a polymer, for example, polymethylmethacrylate, polymethylsiloxane, polyethylmethacrylate, and the like. Therefore, the first light extraction layer has high light transmittance, wide material sources and low cost. According to an embodiment of the present application, a material of the second light extraction layer comprises at least one of a metal oxide or a metal fluoride, and in some embodiments, the material of the second light extraction layer can be, for example, aluminum oxide, zinc oxide, magnesium fluoride, etc. Further, the second light extraction layer contains scattering particles, for example, silica, zirconia, etc. Therefore, light can be further caused to scatter to different directions, which improves the light extraction efficiency.

Figure 5:
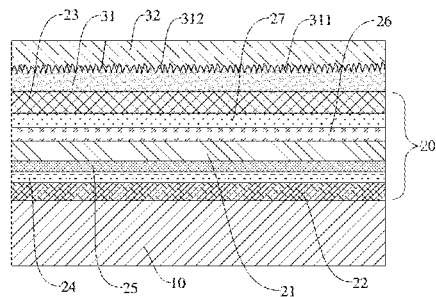
FIG. 5 is a schematic structural diagram of a light-emitting device according to another embodiment of the present application.

In some embodiments, referring to FIG. 1, the light-emitting structure layer at this time can comprise an anode 22, the light-emitting function layer 21, and a cathode 23, which are stacked, wherein the anode 22 is disposed close to the substrate 10. Further, according to actual needs, the light-emitting structure layer 20 can further comprise at least one of a hole injection layer 24 disposed on a surface of the anode 22 away from the substrate, a hole transport layer 25 disposed on a surface of the hole injection layer 24 away from the substrate, an electron transport layer 26 disposed on a surface of the light-emitting function layer 21 away from the substrate, or an electron injection layer 27 disposed on a surface of the electron transport layer 26 away from the substrate (refer to FIG. 5 for a schematic structural diagram, wherein FIG. 5 shows a case where the hole injection layer 24, the hole transport layer 25, the electron transport layer 26, and the electron injection layer 27 are provided). There is no special restriction on a material type of the light-emitting function layer, which can be, for example, an organic light-emitting layer, a quantum dot light-emitting layer, and a perovskite light-emitting layer, etc.

Figure 6:
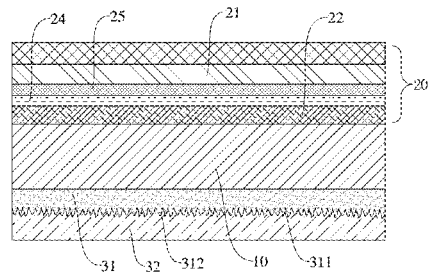
FIG. 6 is a schematic structural diagram of a light-emitting device according to another embodiment of the present application.

For the light-emitting structure layer having the above structure, when the light-emitting device is a bottom-emission light-emitting device, the first light extraction layer 31 can be disposed on a surface of the cathode 23 away from the light-emitting function layer 21 (refer to FIG. 1); and when the light-emitting device is a top-emission light-emitting device, the first light extraction layer 31 can be disposed on a surface of the substrate away from the light-emitting function layer 21 (refer to FIG. 6). Therefore, the light extraction efficiency of the light-emitting device can be improved, and the light-emitting device is easy to fabricate.

Figure 7:
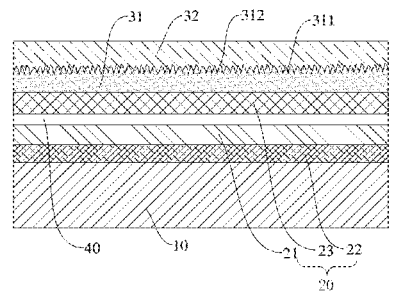
FIG. 7 is a schematic structural diagram of a light-emitting device according to another embodiment of the present application.
Figure 8:
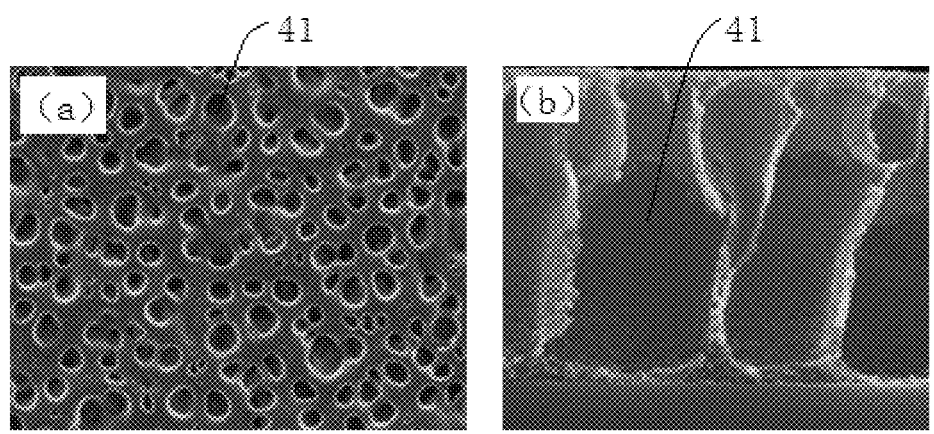
FIG. 8 is a surface topography diagram of a light extraction mesh film according to an embodiment of the present application, wherein (a) is a plane topography diagram and (b) is a cross-section topography diagram.

According to an embodiment of the present application, referring to FIGS. 7 and 8, the light-emitting device further comprises: a light extraction mesh film 40 disposed on the light exit side of the light-emitting function layer 21, the mesh film 40 having a sponge pore structure 41. For example, the sponge pore structure irregularly distributed in the mesh film can change a propagation path of light to destroy the total reflection condition, so that more light is radiated out of the light-emitting device, thereby improving the light extraction efficiency of the light-emitting device.

Figure 9:
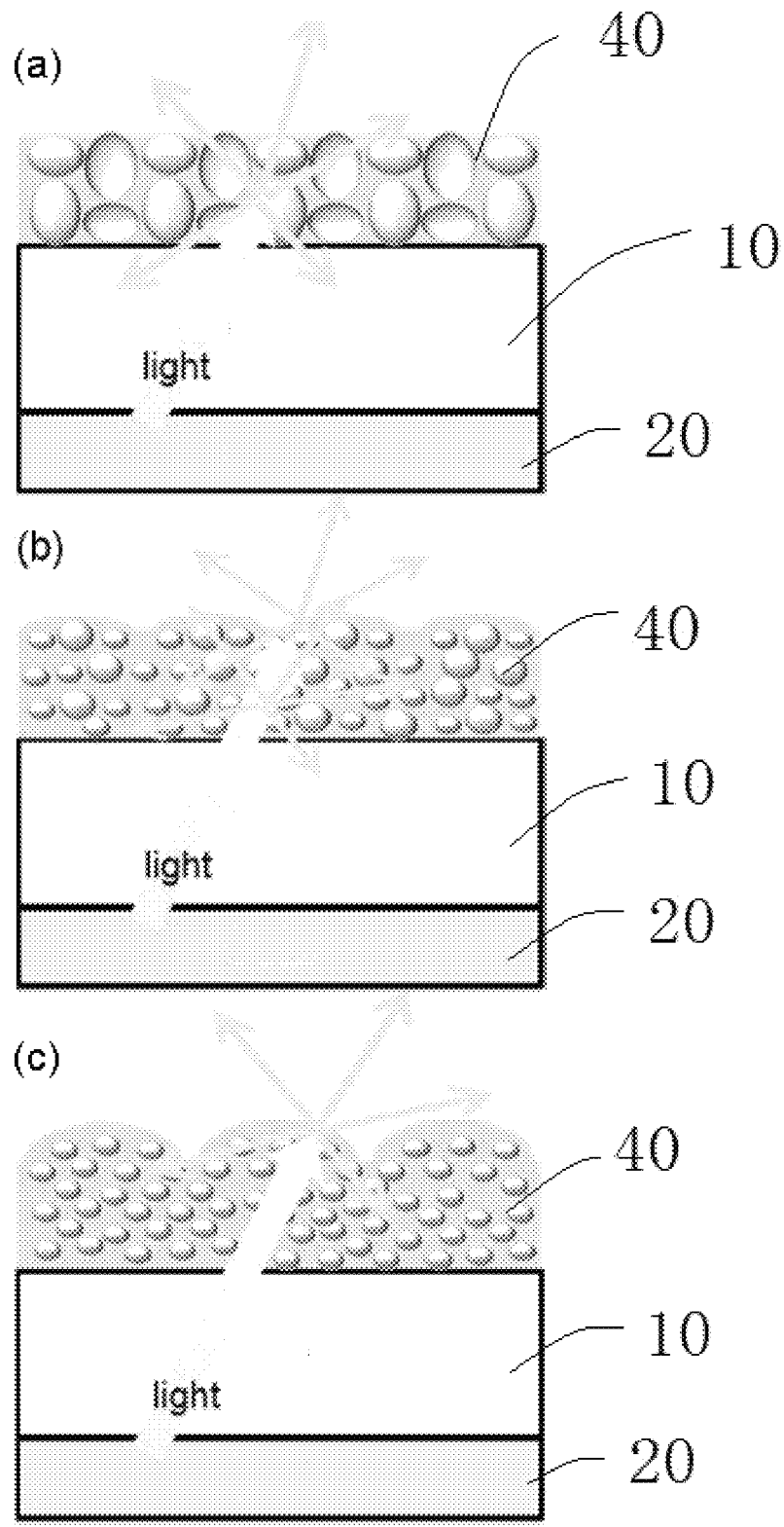
FIG. 9 is a schematic diagram of a light exit mode of a light-emitting device when apertures of light extraction mesh films are different according to an embodiment of the present application.

According to an embodiment of the present application, a thickness of the light extraction mesh film is 10 nm to 30 microns, for example, 10 nm, 100 nm, 500 nm, 1 micron, 5 microns, 10 microns, 15 microns, 20 microns, 25 microns, 30 microns, and the like. Within the thickness range, a better light extraction effect can be achieved, and the transmittance will not be affected by over-thickness. In some embodiments, an aperture of the light extraction mesh film is 40 nm to 1 micron, for example, 40 nm, 100 nm, 300 nm, 500 nm, 800 nm, 1 micron, and the like. For example, referring to FIG. 9, where apertures of light extraction mesh films in (a), (b) and (c) become smaller gradually, it can be seen that light scattering occurs inside the light extraction mesh film when the aperture is larger, and more light scattering occurs on a surface of the light extraction mesh film as the aperture becomes smaller and the surface roughness increases. Therefore, the smaller the aperture, the smaller the light transmittance, and the larger the aperture, the lower the light extraction efficiency, and within the above aperture range, both the better light extraction effect and better transmittance can be achieved.

Further, the light extraction mesh film can contain scattering particles. Light propagation to various different directions can be further facilitated, to improve the light extraction efficiency.

According to an embodiment of the present application, a material of the light extraction mesh film can be a polymer, which can be, for example, a polymer formed by polymerizing at least one of an acrylate monomer, a carbonate monomer, an epoxy resin monomer, a styrene monomer, or a thiol monomer.

As described above, the light-emitting structure layer can have different structures, and the light-emitting structure layer having different structures will be described in detail below.

Figure 10:
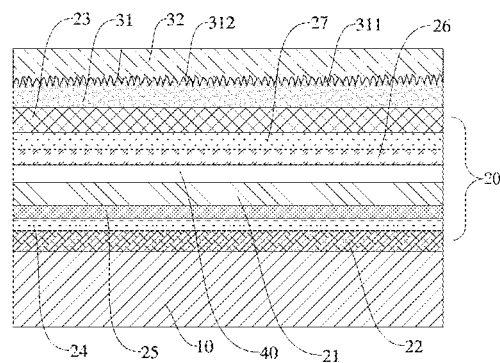
FIG. 10 is a schematic structural diagram of a light-emitting device according to another embodiment of the present application.
Figure 11:
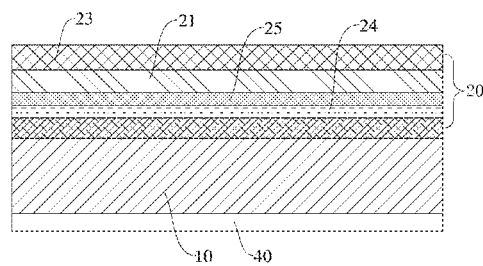
FIG. 11 is a schematic structural diagram of a light-emitting device according to another embodiment of the present application.

In some embodiments, referring to FIG. 10, the light-emitting structure layer comprises a cathode 23, the light-emitting function layer 21, and an anode 22, which are stacked, wherein the anode 22 is disposed close to the substrate 10. Further, at least one of a hole injection layer 24, a hole transport layer 25, an electron transport layer 26, or an electron injection layer 27 can be further provided as needed, for example, which are consistent with what is described in the foregoing and are not repeated here. For the light-emitting device having the above structure, when the light-emitting device is a bottom-emission light-emitting device, referring to FIG. 10, the light extraction mesh film 40 can be disposed on a surface of the light-emitting layer 21 away from the anode 22; and when the light-emitting device is a top-emission light-emitting device, referring to FIG. 11, the light extraction mesh film 40 is disposed on a surface of the substrate 10 away from the light-emitting function layer 21.

It can be understood that, according to use needs, the light-emitting device can have a plurality of pixel units, each pixel unit has a plurality of sub-pixels, light emission colors of the plurality of sub-pixels in each pixel unit can be the same or different, and when each pixel unit comprises a plurality of sub-pixels with different light emission colors, the light-emitting device can realize color light emission. At this time, the light extraction mesh film can be a whole-layer structure, and it can also be a patterned structure provided to correspond to the sub-pixels, which is, for example, that the light extraction mesh film can be patterned through a photolithography process to form the light extraction mesh film only in the sub-pixel area, so that crosstalk between the sub-pixels can be effectively prevented while the efficiency of the light-emitting device is improved.

According to an embodiment of the present application, the light-emitting device comprises a plurality of pixel units, each of which comprises a plurality of sub-pixels, the light extraction mesh film satisfying at least one of the following conditions: the light extraction mesh film being a whole-layer structure, an orthographic projection of the light extraction mesh film on the substrate covering orthographic projections of the plurality of pixel units on the substrate; or the light extraction mesh film comprising a plurality of sub light extraction mesh films, an orthogonal projection of each of the sub light extraction mesh films on the substrate covering one of the sub-pixels.

Figure 12:
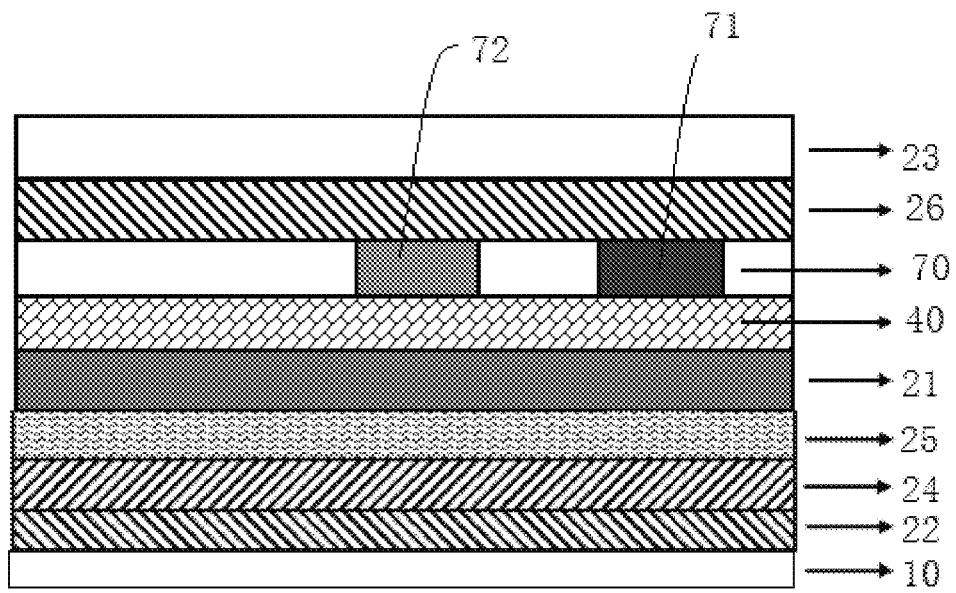
FIG. 12 is a schematic structural diagram of a light-emitting device according to another embodiment of the present application.

In some embodiments, referring to FIG. 12, the light-emitting function layer 21 is a whole-layer structure, sub-pixel areas of different colors are respectively provided with color filters 70 of corresponding colors, and the light extraction mesh film 40 is also a whole-layer structure. FIG. 12 shows a case where the light-emitting function layer 21 emits blue light and the color filter 70 comprises a red filter 71 and a green filter 72, then a position where no color filter is provided emits blue light to form a blue sub-pixel, and positions where the red filter and the green filter are provided emit red light and green light respectively to form a red sub-pixel and a green sub-pixel respectively, thereby realizing full-color light emission.

Figure 13:
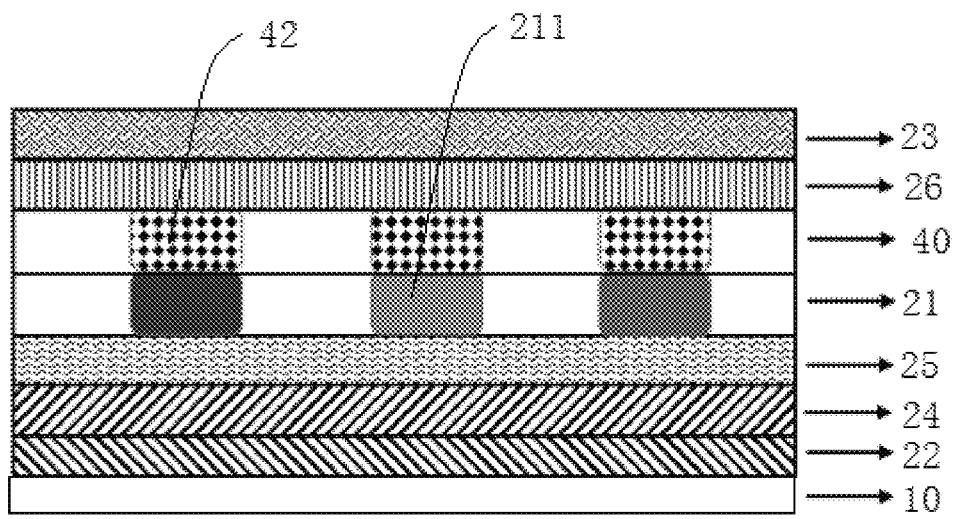
FIG. 13 is a schematic structural diagram of a light-emitting device according to another embodiment of the present application.

In other embodiments, referring to FIG. 13, the light-emitting function layer 21 comprises a plurality of sub light-emitting layers 211 of different colors, which are provided at intervals, each of the sub light-emitting layers corresponding to one sub-pixel, the light extraction mesh film 40 comprising a plurality of sub light extraction mesh films 42, which are provided at intervals, an orthographic projection of each of the sub light extraction mesh films 42 on the substrate covering an orthographic projection of one of the sub light-emitting layers 211 on the substrate.

Figure 14:
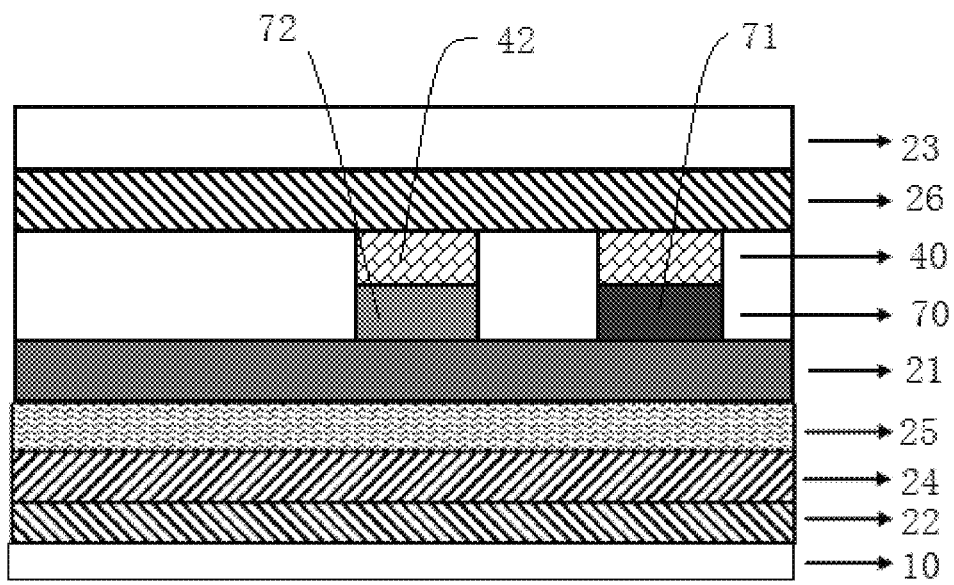
FIG. 14 is a schematic structural diagram of a light-emitting device according to another embodiment of the present application.

In still other embodiments, in a light-emitting device capable of realizing color light emission, a sub light extraction mesh film can be disposed only in part of sub-pixels according to actual use needs. Referring to FIG. 14, the light-emitting function layer 21 is a whole-layer structure and emits blue light, no color filter is provided in a blue sub-pixel, a red filter 71 and a green filter 72 are respectively provided in a red sub-pixel and a green sub-pixel, the color filters are disposed on a surface of the light-emitting function layer 21 away from the substrate, and the sub light extraction mesh films 42 are disposed on surfaces of the red filter 71 and the green filter 72 away from the substrate.

Figure 15:
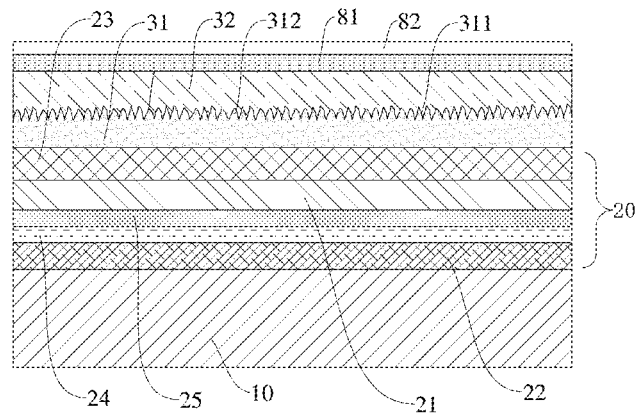
FIG. 15 is a schematic structural diagram of a light-emitting device according to another embodiment of the present application.

It can be understood that the light-emitting device can have other necessary structures and components in addition to the structures described above, for example, in some embodiments, referring to FIG. 15, the light-emitting device can further comprise a light extraction adaptation layer 81 disposed on one side of the first light extraction layer 31 or the second light extraction layer 32 away from the light-emitting function layer 21, and an encapsulation layer 82 disposed on one side of the light extraction adaptation layer 81 away from the light-emitting function layer 21.

In other embodiments, the light-emitting device is a backlight module, the light-emitting function layer is a light source of the backlight module, and at this time, the light extraction mesh film can be disposed on the light exit side of the light-emitting function layer. In some embodiments, referring to FIG. 16, the light extraction mesh film 40 is located on one side of the backlight module close to a light exit direction, and a surface of the light extraction mesh film 40 away from the light-emitting function layer 21 forms a light exit surface of the backlight module. For example, when applied to a liquid crystal display device, referring to FIG. 16, the light extraction mesh film 40 is provided between the light-emitting function layer 21 and a polarizer 50, and a liquid crystal display panel 60 is further disposed on one side of the polarizer 50 away from the light extraction mesh film 40.

Figure 22:
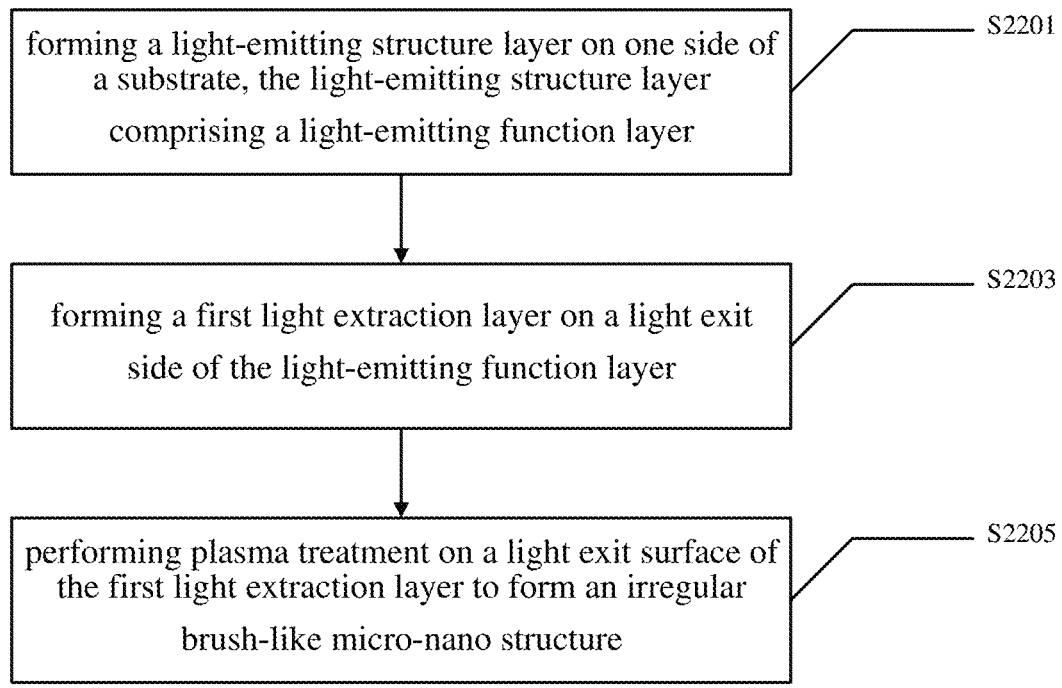
FIG. 22 is a flow chart for a method of fabricating a light-emitting device according to an embodiment of the present application.

In another aspect of the present application, there is provided a method 2200 of fabricating a light-emitting device, as shown in FIG. 22. According to an embodiment of the present application, the method 2200 comprises: at step S2201, forming a light-emitting structure layer on one side of a substrate, the light-emitting structure layer comprising a light-emitting function layer; at step S2203, forming a first light extraction layer on a light exit side of the light-emitting function layer; and at step S2205, performing plasma treatment on a light exit surface of the first light extraction layer to form an irregular brush-like micro-nano structure.

The steps of the method are simple, convenient and easy to implement, and the fabricated light-emitting device has a higher light extraction efficiency.

According to an embodiment of the present application, parameters of the plasma treatment can be flexibly adjusted according to actual needs, and in some embodiments, the plasma treatment is performed adopting at least one of oxygen plasma or argon plasma; the plasma treatment is performed with a power of 150-250 W, for example, 150 W, 180 W, 200 W, 220 W, 250 W, etc.; the plasma treatment is performed for a duration of 90 to 120 seconds (for example, 90 seconds, 95 seconds, 100 seconds, 105 seconds, 110 seconds, 115 seconds, 120 seconds, etc.). Within the parameter range, a better irregular brush-like micro-nano structure with the irregular brush-like shape can be realized, which has a better light extraction effect.

According to an embodiment of the present application, the method can further comprise: forming a second light extraction layer on the light exit surface of the first light extraction layer, wherein a refractive index of the second light extraction layer is different from a refractive index of the first light extraction layer. For example, the second light extraction layer can be fabricated by physical vapor deposition or chemical vapor deposition, for example, by evaporation, sputtering, or the like, and steps and parameters thereof can be selected and adjusted according to actual situations, which are not repeated here.

According to an embodiment of the present application, the method can further comprise: forming a light extraction mesh film on the light exit side of the light-emitting function layer, wherein the mesh film has a sponge pore structure. According to an embodiment of the present application, the forming a light extraction mesh film can comprise: uniformly mixing raw materials for forming the light extraction mesh film to obtain a first mixture; after the first mixture is sprayed into a film, curing the film with ultraviolet radiation to obtain a cured film layer; and removing liquid crystal in the cured film layer to obtain the light extraction mesh film, wherein the raw materials comprise a monomer, a liquid crystal, a photoinitiator, and nano microbeads, or the raw materials comprise a monomer, a liquid crystal, a photoinitiator, scattering particles, and nano microbeads. Therefore, the operation is simple and convenient, and the obtained light extraction mesh film has a better light extraction effect.

For example, the raw materials can be mixed uniformly by a vortex oscillator. Therefore, the operation is convenient and has a better mixing effect. Moreover, the liquid crystal is removed by soaking in an organic solvent, for example, the organic solvent that can be used comprising, but not limited to, propane, chloroform, tetrahydrofuran, etc. Therefore, the effect of removing the liquid crystal is better, and certainly, it can be understood that, due to process limitations and the like, in the light extraction mesh film, there may be some liquid crystal residues, which will not affect the effect of the light extraction mesh film improving the light extraction efficiency.

For example, in the method, a mass ratio of the monomer, the liquid crystal, the photoinitiator and the nano microbeads is 10:(5-12):(0.05-0.2):(0.1-0.2); amount of the scattering particles is 2-10 wt % of total mass of the monomer; and the curing with ultraviolet radiation can be performed at a temperature of 0-30° C., a wavelength of 365 nm, an intensity of 3-15 mW/cm$^2$, and a duration of 2-20 min.

According to an embodiment of the present application, the monomer can comprise at least one of an acrylate monomer, a carbonate monomer, an epoxy resin monomer, a styrene monomer, or a thiol monomer; the liquid crystal can comprise at least one of a nematic liquid crystal, a cholesteric liquid crystal, or a smectic liquid crystal; the photoinitiator comprises benzoin dimethyl ether; the nano microbeads comprise glass microbeads; and the scattering particles comprise at least one of zirconia or silica.

It should be noted that the light extraction layer and the light extraction mesh film involved in the method of fabricating the light-emitting device can be consistent with the light extraction layer and the light extraction mesh film in the light-emitting device described above, and the light-emitting device in the method can also be consistent with the light-emitting device described above, which are not repeated here.

In yet another aspect of the present application, there is provided a display device or lighting device. According to an embodiment of the present application, the display device or lighting device comprises the light-emitting device described above. The display device or lighting device has higher light extraction efficiency, low energy consumption and better display effect or lighting effect.

It can be understood that, besides the light-emitting device described above, the display device or the lighting device can further comprise other necessary structures and components of a conventional display device or lighting device, and taking the display device as an example, the display device can further comprise a touch module, a motherboard, a battery, a housing, and the like, which are not repeated here.

Examples of the present application will be described in detail below.

Example 1

Figure 17:
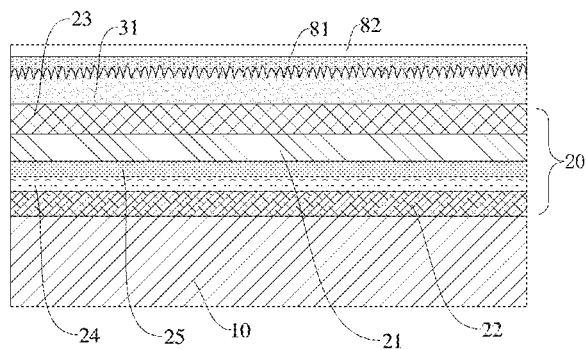
FIG. 17 is a schematic structural diagram of a light-emitting device according to another embodiment of the present application.

A light-emitting device with a light extraction structure is shown in FIG. 17, which comprises a substrate 10, an anode 22, a hole injection layer 24, a hole transport layer 25, an organic-small-molecule light-emitting function layer 21, a cathode 23, a first light extraction layer 31, a light extraction adaptation layer (LiF layer) 81, and an encapsulation layer (TFE) 82.

A diode top-emission device based on organic small-molecule light emission was fabricated using an evaporation process. After the first light extraction layer had been evaporated, an $O_2$ Plasma (radio frequency power: 200 W, duration: 90 s) process was performed on a surface of the first light extraction layer by reactive ion etching (RIE) technique, to form a brush-like micro-nano structure on the surface of the first light extraction layer, as shown in FIG. 2, a size of the micro-nano structure could be adjusted according to Plasma process parameters. Next, evaporation processes on LiF and TFE were continuously performed to complete the fabrication of the device.

In the example, the fabrication of the light extraction structure is based on the plasma process, so that the method of fabricating the light-emitting device has a simple process, extremely low cost, and significant improvement on the performance of the light-emitting device.

Comparative Example 1

It was the same as the Example 1, except that the light exit surface of the first light extraction layer was not subjected to the plasma treatment.

Example 2

It was the same as the Example 1, except that after the plasma treatment had been performed, an $Al_2O_3$ layer was sputtered on the light exit surface of the first light extraction layer as the second light extraction layer, which had a thickness of 70 nm and a refractive index of 1.75.

Example 3

It was the same as the Example 2, except that the second light extraction layer had a material of $Z_nO$, a thickness of 70 nm, and a refractive index of 2.0.

Example 4

It was the same as the example 1, except that the light-emitting function layer was a red light quantum dot light-emitting layer, PEDOT was selected as the hole injection layer, and a quantum dot was selected as the light-emitting layer.

Comparative Example 2

It was the same as the Example 4, except that the plasma treatment process was not performed on a surface of the first light extraction layer.

Example 5

It was the same as the Example 1, except that the light-emitting function layer was a perovskite light-emitting layer.

Comparative Example 3

It was the same as the Example 5, except that the plasma treatment process was not performed on a surface of the first light extraction layer.

Example 6

The light-emitting device is a bottom-emission device (see FIG. 6 for a schematic structural diagram), in which the light-emitting function layer is an electroluminescent organic light-emitting layer. For example, in ITO glass (in which glass was a substrate, and an ITO layer on the glass was taken as an anode), a surface of the glass away from the ITO layer was spin-coated with polyethyl methacrylate, heated to 140° C. and cured for 30 min, then subjected to O2 Plasma (radio frequency power: 200 W, duration: 120 s), and then sputtered with a layer of magnesium fluoride.

Comparative Example 4

It was the same as the Example 6, except that on the ITO glass, spin-coating polyethyl methacrylate and sputtering magnesium fluoride were not performed.

Performance Tests

The light-emitting devices obtained in the above Examples 1 to 6 and Comparative examples 1 to 4 were subjected to a luminance and chromaticity coordinate (CIE X) test, for example, an IVL performance test using a current-voltage-luminance test system.

Luminance test results were shown in the following table:

|  | Light extraction structure | Luminance cd/A @(10 mA/cm$^2$) | Luminance increase ratio (%) | Spectral peak displacement distance (nm) (0°-60°) |
|---|---|---|---|---|
| Comparative example 1 | none | 1058 | / | 8 |
| Example 1 | first light extraction layer | 1325 | 25.2 | 4 |
| Example 2 | first light extraction layer + second light extraction layer | 1484 | 40.2 | 10 |
| Example 3 | first light extraction layer + second light extraction layer | 1438 | 35.9 | 9 |
| Comparative example 2 | none | 1965 | / | / |
| Example 4 | first light extraction layer | 2495 | 27.0 | / |
| Comparative example 3 | none | 1682 | / | / |
| Example 5 | first light extraction layer | 2094 | 24.5 | / |

-continued

|  | Light extraction structure | Luminance cd/A @(10 mA/cm²) | Luminance increase ratio (%) | Spectral peak displacement distance (nm) (0°-60°) |
|---|---|---|---|---|
| Example 6 | first light extraction layer + second light extraction layer | 2305 | 34 | 6 |
| Comparative example 4 | none | 1721 | / | / |

The luminance increase ratios of the Examples 1 to 3 are increase ratios relative to the Comparative example 1, the luminance increase ratio of the Example 4 is an increase ratio relative to the Comparative example 2, the luminance increase ratio of the Example 5 is an increase ratio relative to the Comparative example 3, and the luminance increase ratio of the Example 6 is an increase ratio relative to the Comparative example 4. / denotes that the test was not performed.

Figure 18:
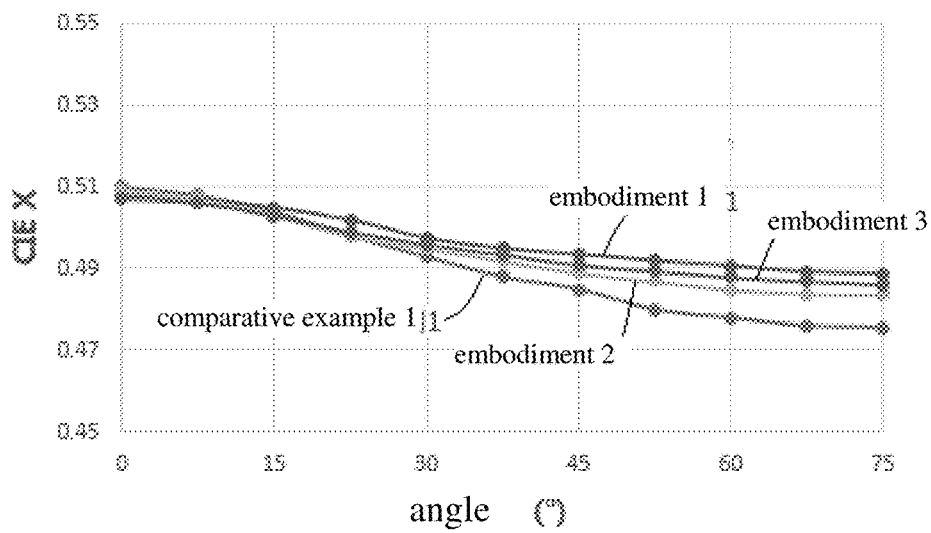
FIG. 18 is a chromaticity coordinate test curve according to part of the embodiments of the present application and comparative examples.

Part of the CIE X test results were shown in FIG. 18.

Example 7

Raw materials: monomer A: lauryl Methacrylate (LMA), monomer B: isobornyl methacrylate (IBMA), monomer C: polyethylene glycol diacrylate-400 (PEGDA-400), mass percentages of the monomers used: monomer A/monomer B=10: 15-14:11, (monomer A+monomer B)/monomer C=6: 1-1:6; nematic liquid crystal SLC1717 being 80-120 wt % of total mass of the monomers; benzoin dimethyl ether with photoinitiator added (Irgacure 651) being 0.5-2 wt % of the total mass of the monomers; content of nano microbeads being 1-2 wt % of the total mass of the monomers.

A method of fabricating a light extraction mesh film (called a mesh film for short) is as follows: uniformly mixing the above raw materials by a vortex oscillator, spraying them on a glass surface of the ITO glass with a thickness of about 0.2-20 microns, then irradiating them using a 365 nm-ultraviolet radiometer (ultraviolet intensity: 3-15 mW/cm²) for 2-20 min at 0-30° C., then soaking them in propane for 1-10 h to remove the liquid crystal. Surface and cross-section topographies of the fabricated mesh film were shown in FIG. 2.

An OLED light-emitting device 1: the device structure being mesh film/ITO (substrate+anode)/HIL (Hole Injection Layer) (10 nm)/HTL (Hole Transport Layer) (100 nm)/GH (host material): 5 wt % GD (green luminescent guest material with a mass ratio of 5%) (light-emitting function layer) (20 nm)/ETL (Electron Transport Layer) (40 nm)/LiF (Electron Injection Layer)/Al (cathode).

Comparative Example 5

It was the same as the Example 7, except that a mesh film was not formed on ITO glass.

Example 8

Raw materials: the same as those in the Example 7, except that nematic liquid crystal SLC1717 was 60-140 wt % of the total mass of the monomers.

A method of fabricating a mesh film: the same as the method in the Example 7.

The light-emitting device 2: the same as the structure in the Example 7, except that the mesh film in this example was adopted.

Example 9

Raw materials: the same as those in the Example 7, except that $ZrO_2$ scattering particles being 2-10 wt % of the total mass of the monomers was added.

A method of fabricating a mesh film: the same as the method in the Example 7.

The light-emitting device 3: the same as the structure in the Example 7, except that the mesh film in this example was adopted.

Example 10

It was the same as the Example 7, except that the structure of the OLED light-emitting device was shown in FIG. 13.

Example 11

It was the same as the Example 7, except that the light-emitting device was a QLED light-emitting device and the structure of the device was shown in FIG. 12, in which the color filter 70 was formed by a quantum dot.

Example 12

It was the same as the Example 11, except that the structure of the light-emitting device was shown in FIG. 14.

Example 13

Figure 16:
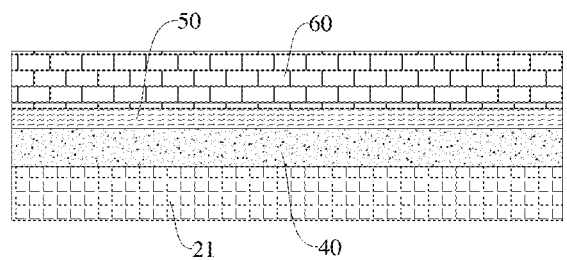
FIG. 16 is a schematic structural diagram of a liquid crystal display device according to another embodiment of the present application.

The mesh film was the same as that in the Example 7, except that the light-emitting device was an LCD backlight module and the structure of the device is shown in FIG. 16. The mesh film was disposed between a backlight source and a polarizer, which could effectively improve a light extraction efficiency of the backlight source, improve efficiency of the device, and reduce power consumption of the device.

Performance Tests:

The light-emitting devices obtained in the above Examples 7 to 13 and the Comparative example 5 were subjected to the IVL performance test and the chromaticity coordinate test using the current-voltage-luminance test system.

Figure 19:
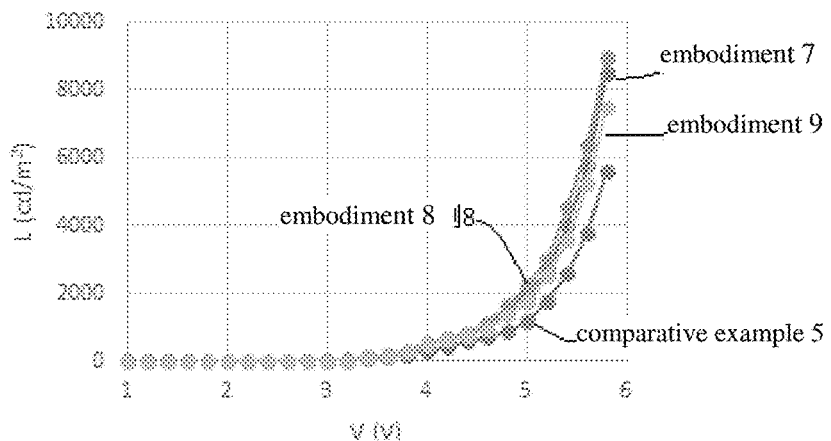
FIG. 19 is a luminance test curve according to some of the embodiments of the present application and comparative examples.
Figure 20:
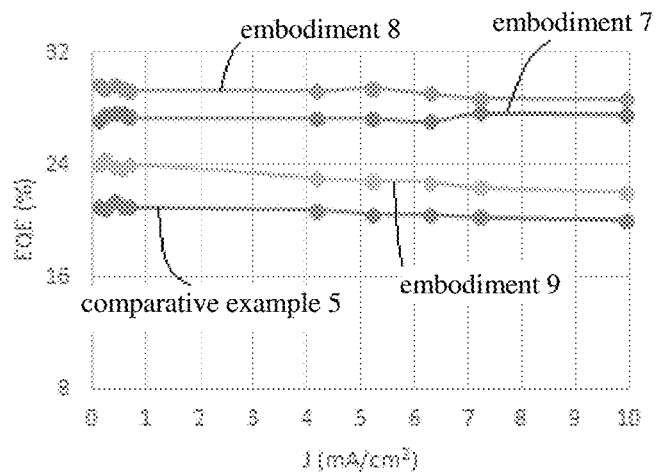
FIG. 20 is an external quantum efficiency curve according to part of the embodiments of the present application and comparative examples.
Figure 21:
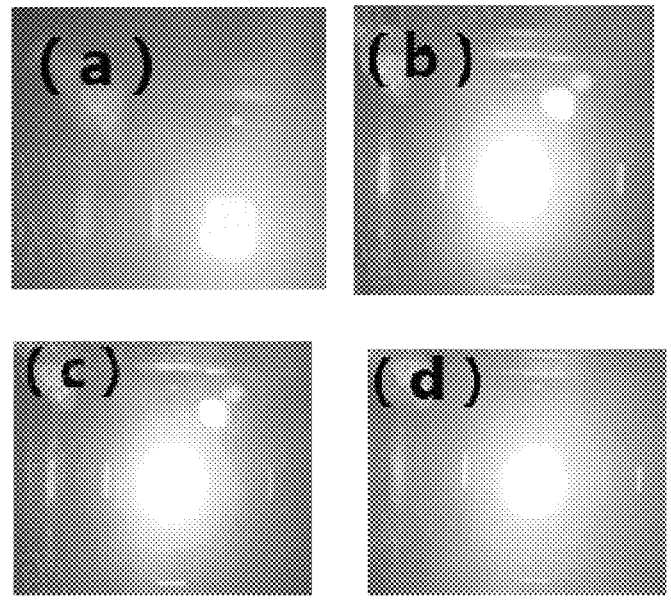
FIG. 21 is a lighting comparison diagram according to part of the embodiments of the present application and comparative examples, where (a) is a comparative example 5, (b) is an example 7, (c) is an example 8, and (d) is an example 9, and J=15 mA/cm$^2$.

Test results were shown in the following tables and in FIGS. 19, 20 and 21:

|  | Turn-on voltage $V_{on}$ (V) | Current efficiency CE (cd/A) | External quantum efficiency $EQE_{max}$ (%) | Full width at half maximum FWHM | Chromaticity coordinate CIE (x, y) |
|---|---|---|---|---|---|
| Comparative example 5 | 2.91 | 50.21 | 21 | 56 | (0.27, 0.69) |
| Example 7 | 2.91 | 60.56 | 27 | 55 | (0.27, 0.69) |
| Example 8 | 2.92 | 65.58 | 29 | 56 | (0.27, 0.70) |
| Example 9 | 2.91 | 58.50 | 24 | 59 | (0.27, 0.68) |

From the above test results, it can be seen that the current efficiency and the external quantum efficiency of the light-emitting device were significantly improved on the premise of not affecting other performances of the light-emitting device.

In the description of the present application, it should be understood that terms "first" and "second" are used for descriptive purposes only and cannot be understood as indicating or implying relative importance or as implicitly implying that the number of indicated technical features. Therefore, a feature defined with "first" or "second" can explicitly or implicitly comprise one or more of that feature. In the description of the present application, "a plurality" means two or more unless explicitly defined otherwise.

In the description of this specification, the description of reference terms "an embodiment", "some embodiments", "an example", "a specific example", or "some examples", etc., mean that features, structures, materials, or characteristics described in conjunction with the embodiment or example are comprised in at least an embodiment or example of the present application. In this specification, the schematic representations of the above terms are not necessarily intended to refer to a same embodiment or example. Furthermore, the described features, structures, materials, or characteristics can be combined in any suitable manner in any one or more embodiments or examples. Moreover, in the case of no contradictions, different embodiments or examples as well as features of the different embodiments or examples described in this specification can be combined and united by those skilled in the art.

While the embodiments of the present application have been shown and described above, it can be understood that the above embodiments are exemplary and cannot be understood as restrictions on the present application and that changes, modifications, substitutions and alterations to the above embodiments can be made by one of ordinary skill in the art within the scope of the present application.

What is claimed is:

1. A method of fabricating a light-emitting device, comprising:
    forming a light-emitting structure layer on one side of a substrate, the light-emitting structure layer comprising a light-emitting function layer;
    forming a first light extraction layer on a light exit side of the light-emitting function layer;
    performing plasma treatment on a light exit surface of the first light extraction layer to form an irregular brush micro-nano structure; and
    forming a light extraction mesh film on the light exit side of the light-emitting function layer, wherein the light extraction mesh film has a sponge pore structure, wherein the forming the light extraction mesh film comprises:
    uniformly mixing raw materials for forming the light extraction mesh film to obtain a first mixture;
    after the first mixture is sprayed into a film, curing the film with ultraviolet radiation to obtain a cured film layer; and
    removing a liquid crystal in the cured film layer to obtain the light extraction mesh film,
    wherein the raw materials comprise a monomer, a liquid crystal, a photoinitiator, and nano microbeads, or the raw materials comprise a monomer, a liquid crystal, a photoinitiator, scattering particles, and nano microbeads.

2. The method according to claim 1, wherein the light-emitting structure layer comprises a cathode, the light-emitting function layer, and an anode, which are stacked, the anode is disposed closer to the substrate than the cathode and the light-emitting function layer, and the first light extraction layer satisfies any of the following conditions:
    the light-emitting device being a bottom-emission light-emitting device, the first light extraction layer being disposed on a surface of the cathode away from the light-emitting function layer; or
    the light-emitting device being a top-emission light-emitting device, the first light extraction layer being disposed on a surface of the substrate away from the light-emitting function layer.

3. The method according to claim 1, wherein the light-emitting device comprises a plurality of pixel units, each of the plurality of pixel units comprises a plurality of sub-pixels, and the light extraction mesh film satisfies at least one of the following conditions:
    the light extraction mesh film being a whole-layer structure, an orthographic projection of the light extraction mesh film on the substrate covering orthographic projections of the plurality of pixel units on the substrate; or
    the light extraction mesh film comprising a plurality of sub light extraction mesh films, an orthogonal projection of each of the sub light extraction mesh films on the substrate covering one of the sub-pixels.

4. The method according to claim 1, wherein the light extraction mesh film satisfies at least one of the following conditions:
    a thickness of the light extraction mesh film being 10 nm to 30 microns;
    an aperture of the light extraction mesh film being 40 nm to 1 micron; or
    the light extraction mesh film containing scattering particles.

5. The method according to claim 1, further satisfying any of the following conditions:
    (1) the light-emitting structure layer comprises a cathode, the light-emitting function layer and an anode, which are stacked, the anode being disposed closer to the substrate than the cathode and the light-emitting function layer, the light extraction mesh film satisfying any of the following conditions:
(a) the light-emitting device being a bottom-emission light-emitting device, the light extraction mesh film being disposed on a surface of the light-emitting layer away from the anode; or
(b) the light-emitting device being a top-emission light-emitting device, the light extraction mesh film being disposed on a surface of the substrate away from the light-emitting function layer; or
(2) the light-emitting device being a backlight module, the light-emitting function layer being a light source of the backlight module, the light extraction mesh film being disposed on the light exit side of the light-emitting function layer.

6. The method according to claim 1, wherein the plasma treatment satisfies at least one of the following conditions:
the plasma treatment adopting at least one of oxygen plasma or argon plasma;
the plasma treatment being performed with a power of 150~250 W; or
the plasma treatment having a duration of 90~120 seconds.

7. The method according to claim 1, wherein at least one of the following conditions is satisfied:
the mixing being performed using a vortex oscillator;
a mass ratio of the monomer to the liquid crystal to the photoinitiator to the nano microbeads being 10:(5~12):(0.05~0.2):(0.1~0.2);
amount of the scattering particles being 2-10wt % of total mass of the monomer;
the curing with ultraviolet radiation being performed at a temperature of 0-30° C., a wavelength of 365 nm, an intensity of 3-15 mW/cm2, and for a duration of 2-20 min; or
the liquid crystal being removed by soaking in an organic solvent.

8. The method according to claim 1, wherein at least one of the following conditions is satisfied:
the monomer comprising at least one of an acrylate monomer, a carbonate monomer, an epoxy resin monomer, a styrene monomer, or a thiol monomer;
the liquid crystal comprising at least one of a nematic liquid crystal, a cholesteric liquid crystal, or a smectic liquid crystal;
the photoinitiator comprising benzoin dimethyl ether;
the nano microbeads comprising glass microbeads; or
the scattering particles comprising at least one of zirconia or silica.

9. The method according to claim 1, further comprising:
forming a second light extraction layer on the light exit surface of the first light extraction layer, wherein a refractive index of the second light extraction layer is different from a refractive index of the first light extraction layer.

10. The method according to claim 9, wherein at least one of the following conditions is satisfied:
a difference in refractive index between the first light extraction layer and the second light extraction layer being greater than 0.2;
the refractive index of the first light extraction layer being greater than the refractive index of the second light extraction layer;
a thickness of the second light extraction layer being less than 200 nm;
a light exit surface of the second light extraction layer being a flat surface or having the irregular brush micro-nano structure;
a material of the first light extraction layer comprising at least one of a polymer, an inorganic material or an organic small-molecule;
a material of the second light extraction layer comprising at least one of a metal oxide or a metal fluoride; or
the second light extraction layer containing scattering particles.

* * * * *